United States Patent
Murty et al.

(10) Patent No.: US 10,535,976 B1
(45) Date of Patent: Jan. 14, 2020

(54) OPTICAL DEVICE AND SYSTEM HAVING THERMAL BUFFERS

(71) Applicant: Avago Technologies International Sales Pte. Limited, Singapore (SG)

(72) Inventors: Ramana M. V. Murty, Sunnyvale, CA (US); Tak Kui Wang, San Jose, CA (US)

(73) Assignee: Avago Technologies International Sales Pte. Limited, Singapore (SG)

( * ) Notice: Subject to any disclaimer, the term of this patent is extended or adjusted under 35 U.S.C. 154(b) by 0 days.

(21) Appl. No.: 16/044,811

(22) Filed: Jul. 25, 2018

(51) Int. Cl.
*H01S 5/024* (2006.01)
*H01S 5/183* (2006.01)
*H01S 5/125* (2006.01)
*H01S 5/187* (2006.01)

(52) U.S. Cl.
CPC .......... *H01S 5/02438* (2013.01); *H01S 5/125* (2013.01); *H01S 5/187* (2013.01); *H01S 5/18369* (2013.01)

(58) Field of Classification Search
CPC .. H01S 5/02438; H01S 5/18369; H01S 5/187; H01S 5/183
See application file for complete search history.

(56) References Cited

U.S. PATENT DOCUMENTS

| | | | |
|---|---|---|---|
| 6,795,478 B2 | 9/2004 | Hwang et al. | |
| 6,965,626 B2* | 11/2005 | Tatum | H01S 5/18341 372/43.01 |
| 7,544,945 B2* | 6/2009 | Tan | G01S 7/4811 180/169 |
| 7,860,143 B2 | 12/2010 | Kim et al. | |
| 9,735,545 B1 | 8/2017 | Chen et al. | |
| 2015/0131684 A1* | 5/2015 | Kise | H01S 5/0427 372/26 |

* cited by examiner

*Primary Examiner* — Armando Rodriguez
(74) *Attorney, Agent, or Firm* — Sheridan Ross P.C.

(57) ABSTRACT

A vertical-cavity surface-emitting laser (VCSEL) device includes a first distributed Bragg reflector (DBR) structure of a first conductivity type, and a second DBR structure of a second conductivity type. The second conductivity type is different than the first conductivity type. The VCSEL includes a cavity positioned between the first DBR structure and the second DBR structure. The cavity includes at least one quantum well structure to generate light. The VCSEL includes a first thermal buffer layer positioned between the cavity and the first DBR structure, and a second thermal buffer positioned between the cavity and the second DBR structure.

20 Claims, 5 Drawing Sheets

OPTICAL DEVICE AND SYSTEM HAVING THERMAL BUFFERS

FIELD OF THE DISCLOSURE

Example embodiments are generally directed toward optical devices and systems having thermal buffers.

BACKGROUND

Vertical-Cavity Surface-Emitting Lasers (VCSELs) are used for a variety of applications for measuring distance and/or velocity using time-of-flight (ToF) principles. In some applications, it is desired to detect objects at long distances, for example, 100 m or greater. These applications operate the VCSEL device at high current, which results in undesired heating of the VCSELs that limits a maximum power and/or operating temperature of the VCSELs.

BRIEF DESCRIPTION OF THE DRAWINGS

Inventive concepts are described in conjunction with the appended figures, which are not necessarily drawn to scale.

DETAILED DESCRIPTION

VCSELs are finding applications in automotive and industrial time-of-flight (ToF) sensors for distance and velocity measurement (e.g., for short and long range LIDAR). VCSELs may be operated using short pulses (e.g., 1 ns-40 ns) with low duty cycle (0.001-1%). As the industry develops, there is an increasing demand to generate higher power from single aperture VCSELs to detect objects at distances greater than 100 m. Operating the VCSEL at high current heats up the semiconductor even for the short pulses and limits the maximum power and operating temperature of the VCSEL. Accordingly, it is desired to keep the active region of the VCSEL cool for the duration of the electrical current pulse, thereby allowing the VCSEL to generate more optical power and/or operate over a wider temperature range.

In general, VCSELs are comprised of an active region (or cavity region) sandwiched between two distributed Bragg reflector (DBR) structures that include multiple pairs of alternating low and high refractive index material to generate high reflectance at the desired emission wavelength. The high and low index materials will have different band gaps and the heterojunction presents a barrier for carrier transport. A graded layer may be used between the high and low index materials to reduce the electrical resistance of the DBR. The cavity region contains the light-emitting gain material, for example, quantum wells separated by barriers and bounded on both sides by cladding layers that also act as barriers for carriers. Current confinement is provided to fabricate an efficient laser. This can take several forms including lateral oxidation (Oxide VCSEL), implantation (Implant VCSEL), or an etched mesa. The current confinement can be placed in either P-DBR or N-DBR, or both.

Thermal buffer layers are introduced above and below the cavity to separate the DBR from the cavity. The mean time t it takes for heat generated in the DBR to reach the cavity is given in terms of the properties of the thermal buffer layer:

$$\tau = \frac{d^2}{D_T} = mc_p R_{th}$$

where d is the thickness of thermal buffer layer, $D_T$ is the thermal diffusivity of the thermal buffer layer, m is mass of the thermal buffer layer, $c_p$ is the specific heat per unit mass of the thermal buffer layer, and $R_{th}$ is the thermal resistance of the thermal buffer layer. The goal is to reduce (or alternatively, minimize) the heating of the cavity (quantum well and the barrier layers) during light emission.

The thermal buffer should have low electrical resistance but present a high thermal resistance between the DBR and cavity (cladding). Low electrical resistance to minimize heat generation in the thermal buffer can be achieved with sufficiently high doping (e.g., 2E18 cm-3) and use of a layer with uniform composition. High thermal resistance increases the time taken for the heat generated in the DBR to reach the cavity and can be achieved, for example, with a suitable semiconductor alloy with low thermal conductivity.

In one example embodiment, the thermal buffers are low resistivity p-doped and n-doped layers of thickness d. With sufficiently high doping (e.g., 2E18 cm-3), the heat generated in the low resistivity layers is small and does not significantly raise the temperature of the active region (quantum wells) for the duration of the electrical pulse. The distance between the DBR and cavity (≈d) keeps the heat generated in the DBR section from reaching the quantum well for the duration of the electrical pulse. According to at least one example embodiment, the distance 'd' for the VCSEL (or the thickness of each buffer layer) adheres to the following equation:

$$d > \sqrt{D_T \Delta t}$$

where $\Delta t$ is the pulse width of a signal that generates current to excite the quantum wells to generate light, and $D_T$ is the thermal diffusivity of the thermal buffer layer(s). In one example embodiment, $D_T \Delta t$ is replaced by an integral when multiple materials are used for the thermal buffer.

The impact of the thermal buffer layers introduced in the cavity is illustrated next with an example. The thickness of P and N thermal buffers can be reduced by choosing a material with low thermal diffusivity $D_T$. As an example, GaAs has a thermal diffusivity, $D_T$=0.31 cm²/s, and $Al_{0.50}Ga_{0.50}As$ has a thermal diffusivity, $D_T$=0.06 cm²/s, resulting in more than a 2× reduction in thickness using $Al_{0.50}Ga_{0.50}As$ instead of GaAs. Reducing the thickness of the thermal buffer layers will reduce free carrier absorption loss. The P- and N-doped thermal buffers do not have to have the same thickness.

The P- and N-doped thermal buffer layers can be completely replaced by undoped region to reduce free carrier absorption loss. In practice, there may be some background doping that limits the extension of the depletion region and hence, the thickness of such a thermal buffer. An undoped thermal buffer layer may be useful for very short pulse widths.

According to at least one example embodiment, the P- and/or N-thermal buffer layers can be replaced by compositionally graded regions to reduce the heterojunction barrier and present a low electrical resistance.

For a high power VCSEL operated at extremely high current densities (50-200 kA/cm$^2$) over short duration (e.g., ~1 ns-40 ns), introducing a thermal buffer between the cladding/spacer and DBR will keep the junction cool for the duration of the current pulse.

The ensuing description provides embodiments only, and is not intended to limit the scope, applicability, or configuration of the claims. Rather, the ensuing description will provide those skilled in the art with an enabling description for implementing the described embodiments. It being understood that various changes may be made in the function and arrangement of elements without departing from the spirit and scope of the appended claims.

Various aspects of example embodiments will be described herein with reference to drawings that are schematic illustrations of idealized configurations. As such, variations from the shapes of the illustrations as a result, for example, manufacturing techniques and/or tolerances, are to be expected. Thus, the various aspects of example embodiments presented throughout this document should not be construed as limited to the particular shapes of elements (e.g., regions, layers, sections, substrates, etc.) illustrated and described herein but are to include deviations in shapes that result, for example, from manufacturing. By way of example, an element illustrated or described as a rectangle may have rounded or curved features and/or a gradient concentration at its edges rather than a discrete change from one element to another. Thus, the elements illustrated in the drawings are schematic in nature and their shapes are not intended to illustrate the precise shape of an element and are not intended to limit the scope of example embodiments.

It will be understood that when an element such as a region, layer, section, substrate, or the like, is referred to as being "on" another element, it can be directly on the other element or intervening elements may also be present. In contrast, when an element is referred to as being "directly on" another element, there are no intervening elements present. It will be further understood that when an element is referred to as being "formed" or "established" on another element, it can be grown, deposited, etched, attached, connected, coupled, or otherwise prepared or fabricated on the other element or an intervening element.

Furthermore, relative terms, such as "lower" or "bottom" and "upper" or "top" may be used herein to describe one element's relationship to another element as illustrated in the drawings. It will be understood that relative terms are intended to encompass different orientations of an apparatus in addition to the orientation depicted in the drawings. By way of example, if an apparatus in the drawings is turned over, elements described as being on the "lower" side of other elements would then be oriented on the "upper" side of the other elements. The term "lower" can, therefore, encompass both an orientation of "lower" and "upper" depending of the particular orientation of the apparatus. Similarly, if an apparatus in the drawing is turned over, elements described as "below" or "beneath" other elements would then be oriented "above" the other elements. The terms "below" or "beneath" can therefore encompass both an orientation of above and below.

The phrases "at least one," "one or more," "or," and "and/or" are open-ended expressions that are both conjunctive and disjunctive in operation. For example, each of the expressions "at least one of A, B and C," "at least one of A, B, or C," "one or more of A, B, and C," "one or more of A, B, or C," "A, B, and/or C," and "A, B, or C" means A alone, B alone, C alone, A and B together, A and C together, B and C together, or A, B and C together.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and this disclosure.

As used herein, the singular forms "a," "an," and "the" are intended to include the plural forms as well, unless the context clearly indicates otherwise. It will be further understood that the terms "include," "includes," 'including," "comprise," "comprises," and/or "comprising," when used in this specification, specify the presence of stated features, integers, steps, operations, elements, and/or components, but do not preclude the presence or addition of one or more other features, integers, steps, operations, elements, components, and/or groups thereof. The term "and/or" includes any and all combinations of one or more of the associated listed items.

Figure 1:
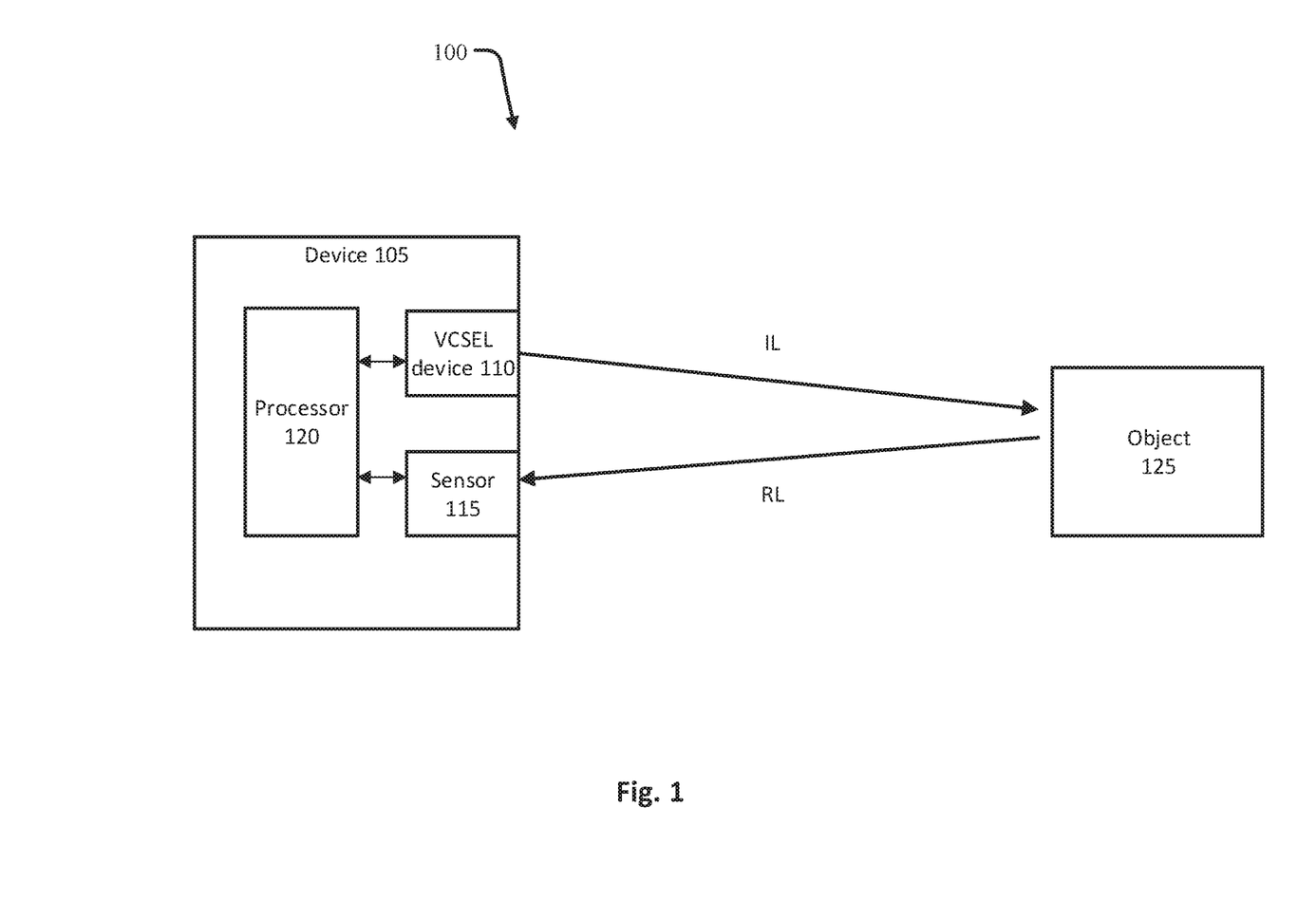
FIG. 1 is a block diagram depicting an optical system in accordance with at least one example embodiment.

FIG. 1 illustrates an optical system 100 according to at least one example embodiment.

As shown in FIG. 1, the system 100 includes a device 105 and an object 125. The device may include a VCSEL device 110, a sensor 115, and at least one processor 120. In operation, the processor 120 controls the VCSEL device 110 to emit light (e.g., having a wavelength greater than 750 nm, for example, 850 nm) toward the object 125, represented in FIG. 1 as incident light IL. The incident light IL reflects from the object 125 back toward the device 105 as reflected light RL, where the sensor 115 senses the reflected light RL and converts the sensed reflected light into an electrical signal. The processor 120 may process the electrical signal to determine a distance to the object 125, a velocity of the object 125, a shape of the object 125, etc.

Figure 2A:
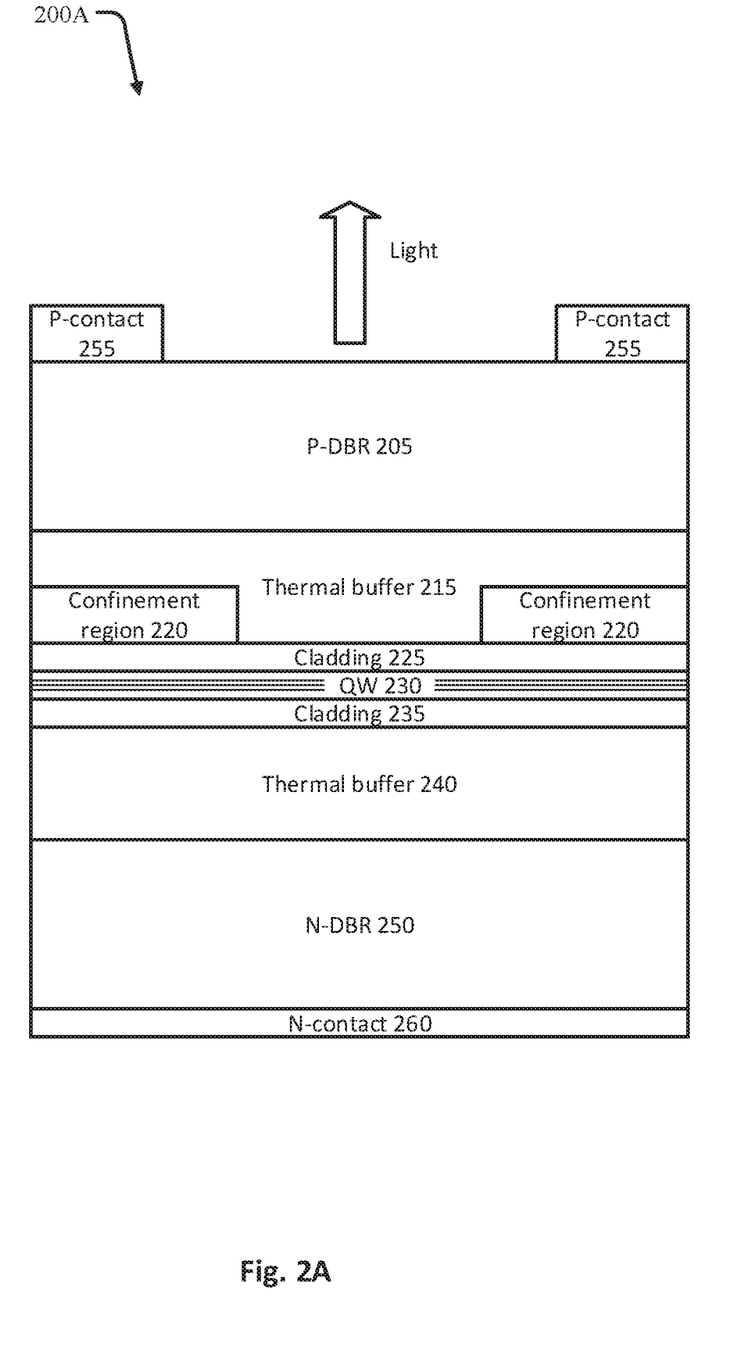
FIG. 2A is a cross-sectional view of an optical device of the optical system in FIG. 1 in accordance with at least one example embodiment.
Figure 2B:
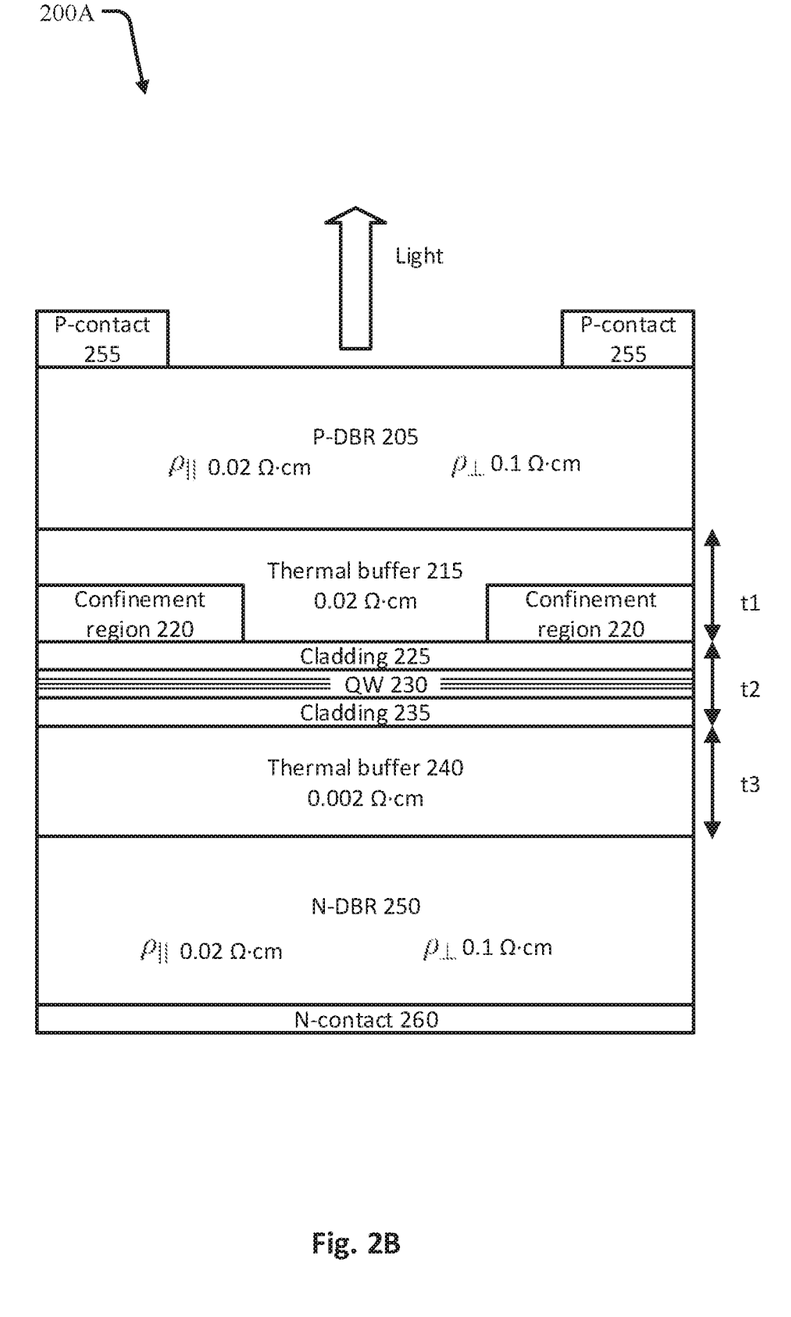
FIG. 2B is a cross-sectional view of the optical device of FIG. 2A in more detail in accordance with at least one example embodiment.

The VCSEL device 110 may include one or more VCSELs formed according to FIGS. 2A and 2B. For example, the VCSEL device 110 may be an array of VCSELs formed, for example, in a matrix or other desired pattern. The VCSEL device 110 is described in more detail below with reference to FIGS. 2A and 2B.

The sensor 115 may be any known sensor for sensing light, for example, an image sensor including one or more pixels (e.g., an array of pixels in a matrix or other desired pattern) for sensing the reflected light RL. The one or more pixels may include one or more photoelectric conversion units (e.g., photodiodes) that convert sensed light into electric charge, which is then output to the processor 120 as an electrical signal.

The at least one processor 120 may include any type of hardware and/or software for processing signals for the system 100. For example, the processor 120 may include a microprocessor with an associated memory including instructions that are executable by the microprocessor. For example, the memory may be random access memory (RAM), read-only memory (ROM), dynamic RAM (DRAM), solid-state disk (SSD), and/or other storage device (s) and media. The memory may be volatile and/or non-volatile in nature. Additionally or alternatively, the processor 120 may include a field programmable gate array (FPGA), an application specific integrated circuit (ASIC) or other circuitry for processing signals of the system 100. The processor 120 as described herein may perform computational functions using any known or future-developed standard, instruction set, libraries, and/or architecture.

According to at least one example embodiment, the processor 120 controls the VCSEL device 110 and the sensor 115 according to known ToF principles. For example, the processor 120 may modulate the light emitted from the VCSEL device 110 (e.g., with radio frequency carriers), and then calculate a phase shift between the emitted light (i.e., IL) and the reflected light RL sensed by the sensor 115 to determine various characteristics of the object 125, such as distance, shape, velocity, etc.

FIG. 2A is a cross-sectional view of an optical device 200A in accordance with at least some embodiments of the present disclosure. The optical device 200A may correspond to a VCSEL in the VCSEL device 110 of FIG. 1. FIG. 2A illustrates an optical device 200A that may be referred to as a top-emission VCSEL.

As shown in FIG. 2A, the optical device (or VCSEL device) 200A includes a p-type distributed Bragg reflector (P-DBR) 205, a thermal buffer 215, a cavity region (or cavity) including a quantum well structure QW 230 for generating light positioned between respective claddings 225/235 (formed of any known material suitable for VCSELs), a thermal buffer 240, and an n-type distributed Bragg reflector (N-DBR). The optical device 200A further includes a confinement region 220, a p-side contact or P-contact 255, and an n-side contact or N-contact 260. The P-DBR region 205 may be a first structure including a first plurality of layers with different refractive indices, where at least some of the first plurality of layers have a first conductivity type (e.g., p-type). Similarly, the N-DBR region 250 may be a second structure including a second plurality of layers with different refractive indices, where at least some of the second plurality of layers have a second conductivity type (e.g., n-type). Here, it should be understood that any suitable or known material may be used to create the DBR regions 205/250.

The cladding layers 225/235 may comprise undoped semiconductor material, such as AlGaAs. The quantum well structure QW 230 may comprise a plurality of layers that generate light based on received current. For example, as is known in the art, the quantum well structure QW 230 may include a layer of semiconductor material (e.g., GaAs) sandwiched between two layers of material having a wider band gap (e.g., AlGaAs) than the semiconductor material.

The contacts 255 and 260 comprise a conductive material (e.g., a metal), and may be coupled to a power source controlled by the processor 120 that applies a power signal to the contacts 255/260 to generate current that excites the quantum well structure QW 230. In FIG. 2A, the contact 255 may be substantially ring-shaped in a plan view so as to create an aperture through which light is emitted. The contact 260 may have a substantially planar structure that covers the bottom surface of the N-DBR 250. Although not explicitly shown, it should be understood that the contact 260 may be bonded to another substrate for the purpose of mounting the optical device 200A in a package and/or to act as a heat sink.

In operation, the optical device 200A is configured to produce a coherent beam of emitted light IL in response to having a voltage applied across the quantum well structure QW 230, thereby causing current to flow to excite the quantum well structure QW 230. The voltage may be applied across the contacts 255/260 under control of the processor 120.

In view of the above, it should be appreciated that example embodiments include an optical device 200A with a first distributed Bragg reflector (DBR) structure 205 of a first conductivity type, and a second DBR structure 250 of a second conductivity type, where the second conductivity type is different than the first conductivity type. The optical device 200A includes a cavity 225/230/235 positioned between the first DBR structure 205 and the second DBR structure 250. The cavity 225/230/235 includes at least one quantum well structure to generate light based on received current. The optical device 200A includes a first thermal buffer layer 215 positioned between the cavity 225/230/235 and the first DBR structure 205. The optical device 200A further comprises a second thermal buffer layer 240 positioned between the cavity 225/230/235 and the second DBR structure 250.

The first thermal buffer layer 215 is the first conductivity type (e.g., p-type), and the second thermal buffer layer 240 is the second conductivity type (e.g., n-type). For example, the first thermal buffer layer 215 may comprise p-doped AlGaAs, and the second thermal buffer layer 240 may comprise n-doped AlGaAs. According to at least one example embodiment, first thermal buffer layer 215 has a substantially uniform impurity concentration (e.g., of p-type dopant), and the second thermal buffer layer 240 has a substantially uniform impurity concentration (e.g., of n-type dopant). Alternatively, the first thermal buffer layer 215 and/or the second thermal buffer layer 240 may comprise undoped semiconductor material.

According to at least one other embodiment, the first thermal buffer layer 215 is compositionally graded away from the cavity 225/230/235 and is p-doped. Similarly, the second thermal buffer layer 240 may be compositionally graded away from the cavity 225/230/235 and be n-doped. In other words, one or both thermal buffer layers 215/240 may have a continuously varying composition in a direction away from the cavity 225/230/235. For example, portions of the thermal buffers 215/240 closest to the cavity 225/230/235 may be GaAs which gradually transitions to $Al_{0.90}Ga_{0.10}As$ at a portion furthest away from the cavity 225/230/235.

As shown, the first thermal buffer layer 215 includes a current confinement region 220 over at least a portion of the cavity 225/230/235. The current confinement region 220 functions to confine current (e.g., injected at the P-contact 255) to a desired region, for example, to the portion of the first thermal buffer layer 215 in contact with the cladding 225, which in turn creates efficient light generation by the quantum well QW 230. As is known in the art, the current confinement region 220 may be formed using lateral oxidation, implantation, and/or with an etched mesa. Although FIG. 2A illustrates the current confinement region 220 as being located in the thermal buffer 215, the region 220 may additionally or alternatively be located in the thermal buffer 240 in a same or similar manner as shown in FIG. 2A. It should be appreciated that the quantum well structure QW 230 emits light in a general upward direction. In some embodiments, the light emitted by the quantum well structure QW 230 is guided by a light guide. As a specific but non-limiting example, if the current confinement region 220 is a mesa structure, then the mesa structure may be used to create an optical refractive index difference between the center and the surrounding regions to help confine the light inside or within the optical device 200A, which may be referred to as index-guiding.

FIG. 2B illustrates the optical device 200A of FIG. 2A in additional detail. In particular, FIG. 2B illustrates resistivities and thicknesses of the layers in FIG. 2A.

According to at least one example embodiment, the thicknesses of t1 and t3 are about 0.50 μm. A thickness t2 may be about 0.25 μm. Here, it should be understood that a thickness t1 of the first thermal buffer layer 215 and a thickness t3 of the second thermal buffer layer 240 are based on thermal diffusivities of the first and second thermal buffer layers 215/240, and a pulse width of a signal that generates a current received by the cavity 225/230/235. For example, a thickness 'd' (i.e., t1 and/or t3) of the first thermal buffer layer 215 and/or the second thermal buffer layer 240 satisfies Equation 1.

$$d > \sqrt{D_T \Delta t},$$ Equation 1 where $D_T$ is a thermal diffusivity of the first thermal buffer layer 215 and/or the second thermal buffer layer 240, and $\Delta t$ is a pulse width of a signal that generates a current received by the cavity 225/230/235. Forming the thermal buffer layers 215/240 to satisfy Equation 1 ensures that heat generated by the first and second DBR structures 205/250 as a result of current injection does not reach the cavity for the duration of the electrical current pulse, thereby improving a maximum power output of the VCSEL and/or operating temperature.

FIG. 2B also illustrates example electrical resistivities of some of the layers in optical device 200A. The DBR structures 205 and 250 may have varying resistivities within each structure. In more detail, the DBR structures may have vertical resistivities $\rho_\perp$ and horizontal resistivities $\rho_\parallel$. The vertical resistivity is taken in a direction of light emission and the horizontal resistivity is taken in a direction perpendicular to the direction of light emission. For example, FIG. 2B shows that a resistivity of the first thermal buffer layer 215 is less than a vertical resistivity $\rho_\perp$ of at least one layer of the first DBR structure 205. In general, the electrical resistivity of DBR is anisotropic ($\rho_\perp \neq \rho_\parallel$) because of the use of a plurality of layers with different bandgaps whereas in this example, the electrical resistivities of thermal buffers 215/240 are isotropic or uniform ($\rho_\perp = \rho_\parallel$). For example, a resistivity of the first thermal buffer layer 215 may be about 0.02 Ω·cm ($\rho_\perp = \rho_\parallel$) and the vertical resistivity $\rho_\perp$ of the first DBR structure 205 may be about 0.1 Ω·cm. Further, a resistivity of the second thermal buffer layer 240 may be less than the vertical resistivity of at least one layer of the second DBR structure 250, and the resistivity of the second thermal buffer layer 240 may be less than the resistivity of the first thermal buffer layer 215. For example, a resistivity of the second thermal buffer layer 240 may be about 0.002 Ω·cm ($\rho_\perp = \rho_\parallel$), and a vertical resistivity $\rho_\perp$ of the N-DBR 250 may be about 0.1 Ω·cm.

It should be understood that the aforementioned thicknesses and the resistivities may vary according to design preferences.

Figure 3A:
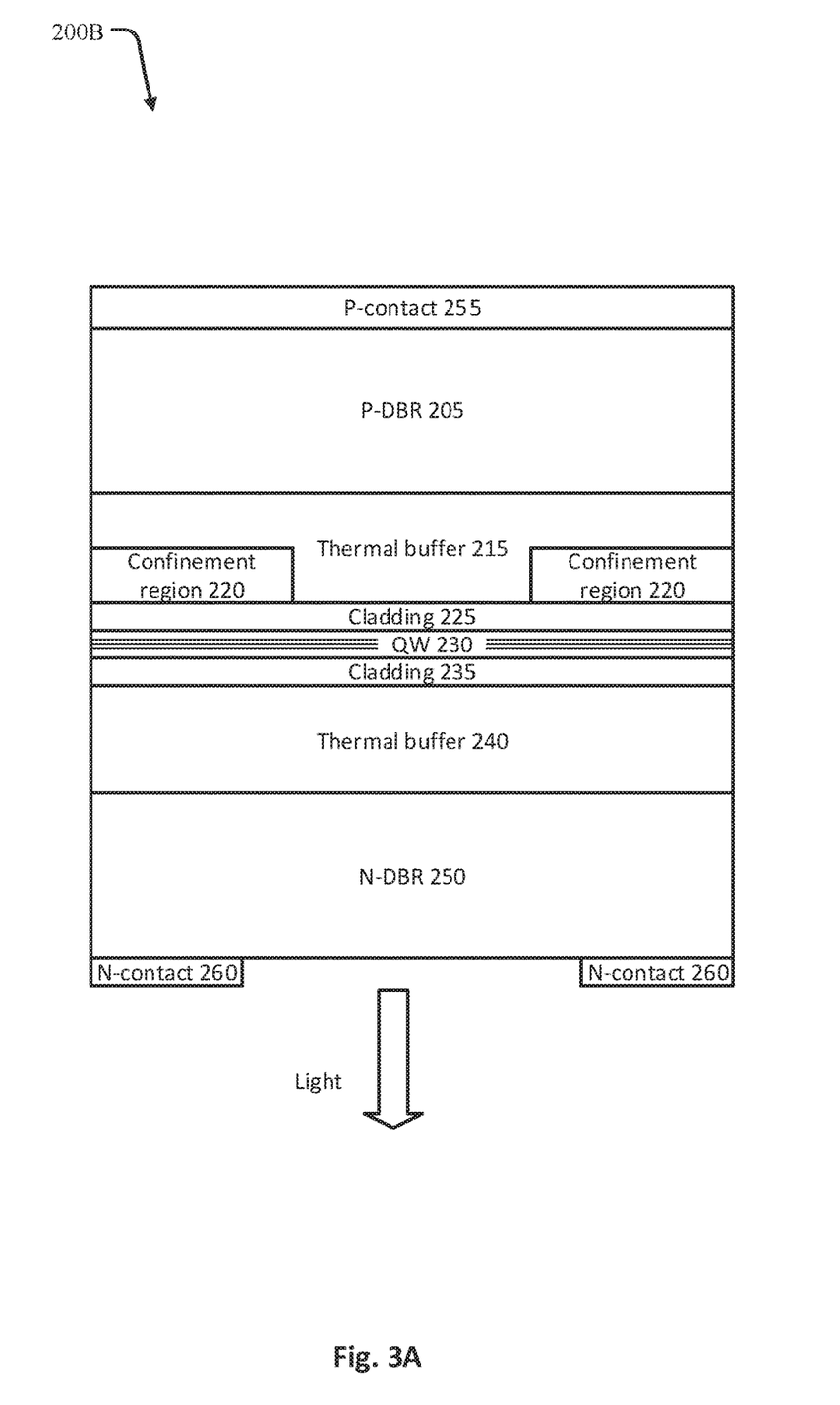
FIG. 3A is a cross-sectional view of an optical device in accordance with at least one example embodiment.
Figure 3B:
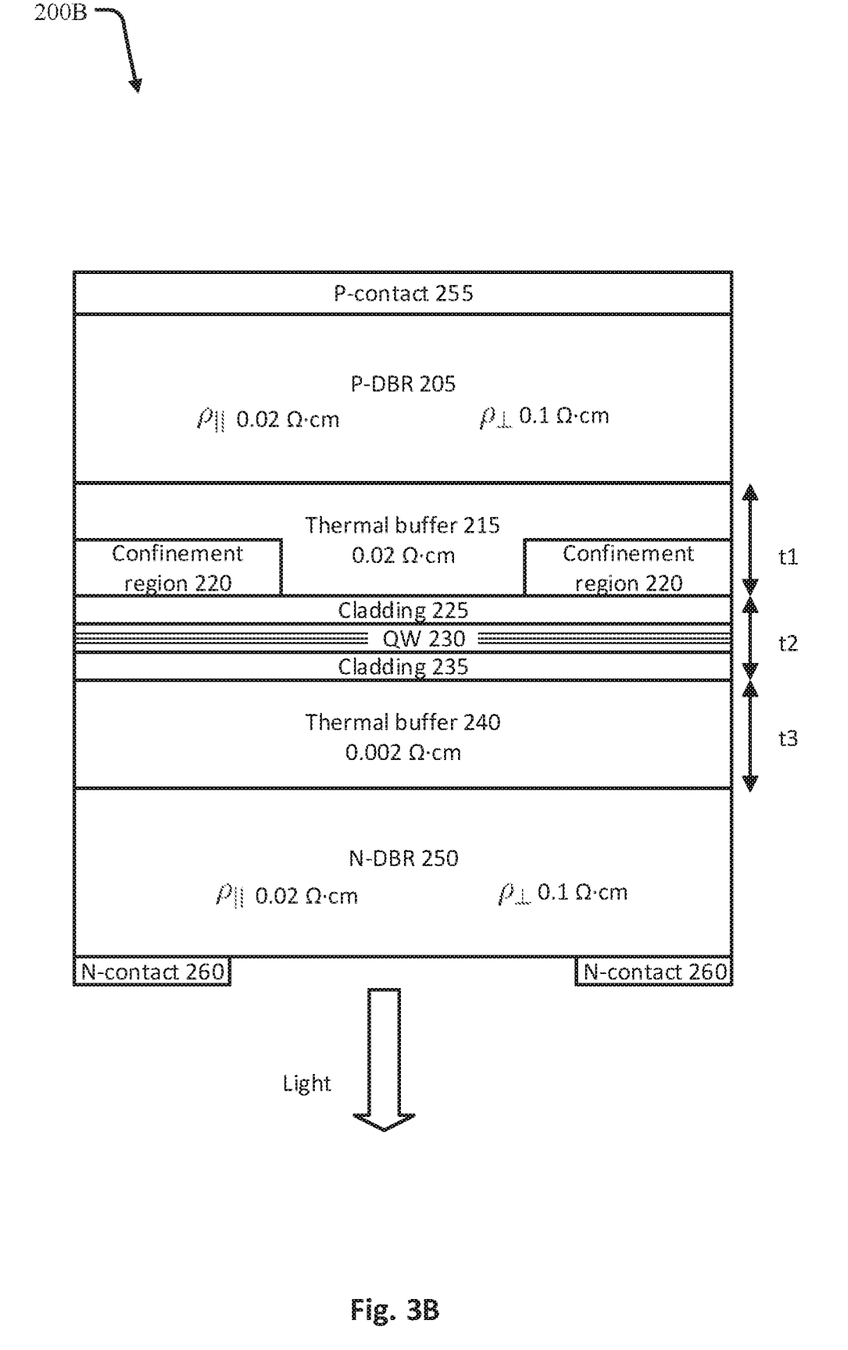
FIG. 3B is a cross-sectional view of the optical device of FIG. 3A in more detail in accordance with at least one example embodiment.

FIG. 3A is a cross-sectional view of an optical device 200B in accordance with at least some embodiments of the present disclosure. FIG. 3B is a cross-sectional view of the optical device 200B of FIG. 3A in more detail in accordance with at least one example embodiment.

Here, it should be understood that the optical device 200B is the same as the optical device 200A in FIGS. 2A and 2B except that the optical device 200B is a bottom-emission VCSEL where the structures of the contacts 255/260 are reversed from the structures of the optical device 200A. That is, the N-contact 260 in FIGS. 3A and 3B has the structure of the P-contact 255 in FIGS. 2A and 2B, and the P-contact 255 in FIGS. 3A and 3B has the structure of the N-contact 260 in FIGS. 2A and 2B. As shown in FIG. 3B, the optical device 200B may have the same thicknesses and electrical resistivities as those mentioned above for the optical device 200A.

Although not explicitly shown, it should be understood that an n-type substrate may be included between the N-DBR structure 250 and the N-contact 260 in the optical devices 200A/200B. It should be further understood that one of the buffer layers 215 or 240 may be excluded from the optical devices 200A/200B if desired.

In view of the above, it should be understood that example embodiments provide optical devices, e.g., VCSELs, that are capable of operating at high current while mitigating or preventing heat generated by the high current from degrading the maximum power of the quantum well structure. That is, a VCSEL according to example embodiments includes one or more thermal buffer layers between the DBR structures and the cavity in order to ensure that the heat generated in the DBR is delayed by the thermal buffer layers from reaching the cavity over the duration of the electrical pulse. Accordingly, a VCSEL according to example embodiments achieves increased maximum power and/or increased maximum operating temperature.

In view of the above, it should be appreciated that example embodiments include an optical device 200A/200B including a first structure 205 including a first plurality of layers with different refractive indices, where at least some of the first plurality of layers have a first conductivity type (e.g., p-type). The optical device 200A/200B includes a second structure 250 including a second plurality of layers with different refractive indices, where at least some of the second plurality of layers have a second conductivity type (e.g., n-type) different than the first conductivity type. The optical device 200A/200B includes a cavity 225/230/235 between the first structure and the second structure, and the cavity 225/230/235 includes at least one quantum well structure 230 to generate light. The optical device 200A/200B includes a first thermal buffer layer 215 of the first conductivity type positioned between the cavity 225/230/235 and the first structure 205.

The optical device 200A/200B further comprises a second thermal buffer layer 240 positioned between the cavity 225/230/235 and the second structure 250.

According to at least one example embodiment, the first thermal buffer layer 215 is the first conductivity type (e.g., p-type), and the second thermal buffer layer 240 is the second conductivity type (e.g., n-type). The electrical resistivity of the first thermal buffer layer 215 is uniform and less than the vertical resistivity of the closest layers of the first plurality of layers 205, and a resistivity of the second thermal buffer layer 240 is uniform and less than a vertical resistivity of the closest layers of the second plurality of layers 250. In at least one example embodiment, the electrical resistivity of the second thermal buffer layer 240 is less than the resistivity of the first thermal buffer layer 215.

Example embodiments also include an optical system 100 including an optical device 200A/200B that emits light toward an object 125. The optical device 200A/200B includes a first structure 205 including a first plurality of layers with different refractive indices, where at least some of the first plurality of layers have a first conductivity type. The optical device 200A/200B includes a second structure 250 including a second plurality of layers with different refractive indices, where at least some of the second plurality of layers have a second conductivity type different than the first conductivity type. The optical device includes a cavity 225/230/235 between the first structure 205 and the second structure 250. The cavity 225/230/235 includes at least one quantum well structure QW 230 to generate light. The first thermal buffer layer 215 of the first conductivity type is positioned between the cavity 225/230/235 and the first structure 205. The system 100 includes a sensor 115 that receives light reflected from the object 125. Here, the reflected light is a reflected version of the emitted light. The system 100 includes at least one processor 120 that determines a distance to the object based on output of the sensor 155.

Specific details were given in the description to provide a thorough understanding of the embodiments. However, it will be understood by one of ordinary skill in the art that the embodiments may be practiced without these specific details. In other instances, well-known circuits, processes, algorithms, structures, and techniques may be shown without unnecessary detail in order to avoid obscuring example embodiments.

While illustrative embodiments have been described in detail herein, it is to be understood that inventive concepts may be otherwise variously embodied and employed, and that the appended claims are intended to be construed to include such variations, except as limited by the prior art.

What is claimed is:

1. A vertical-cavity surface-emitting laser (VCSEL) device, comprising:
   a first distributed Bragg reflector (DBR) structure of a first conductivity type;
   a second DBR structure of a second conductivity type, the second conductivity type being different than the first conductivity type;
   at least one quantum well structure positioned between the first DBR structure and the second DBR structure to generate light; and
   a first thermal buffer layer positioned between the at least one quantum well structure and the first DBR structure,
   wherein a thickness 'd' of the first thermal buffer layer satisfies the following equation:

$$d > \sqrt{D_T \Delta t},$$

where $D_T$ is a thermal diffusivity of the first thermal buffer layer, and $\Delta t$ is a pulse width of a signal that generates a current received by the at least one quantum well structure.

2. The VCSEL device of claim 1, further comprising:
   a second thermal buffer layer positioned between the at least one quantum well structure and the second DBR structure.

3. The VCSEL device of claim 2, wherein the first thermal buffer layer and the second thermal buffer layer are sufficiently thick to keep the heat generated in the first and second DBR structures from reaching the at least one quantum well structure for a duration of an electrical pulse of the signal.

4. The VCSEL device of claim 2, wherein the first thermal buffer layer is the first conductivity type, and the second thermal buffer layer is the second conductivity type.

5. The VCSEL device of claim 4, wherein the first thermal buffer layer has a substantially uniform impurity concentration, and the second thermal buffer layer has a substantially uniform impurity concentration.

6. The VCSEL device of claim 4, wherein the first thermal buffer layer is compositionally graded in a first direction away from the at least one quantum well structure, and wherein the second thermal buffer layer is compositionally graded in a second direction away from the at least one quantum well structure.

7. The VCSEL device of claim 1, wherein the first thermal buffer layer includes a current confinement region over at least a portion of the at least one quantum well structure.

8. The VCSEL device of claim 2, wherein an electrical resistivity of the first thermal buffer layer is uniform and less than a vertical resistivity of the closest layers of the first DBR structure, and an electrical resistivity of the second thermal buffer layer is uniform and less than a vertical resistivity of closest layers of the second DBR structure.

9. The VCSEL device of claim 2, wherein the first thermal buffer layer and the second thermal buffer layer comprise undoped semiconductor material.

10. The VCSEL device of claim 2, wherein a thickness of the first thermal buffer layer and a thickness of the second thermal buffer layer are based on a thickness of the at least one quantum well structure, thermal diffusivities of the first and second thermal buffer layers, and a pulse width of a signal that generates a current received by the at least one quantum well structure.

11. The VCSEL device of claim 1, further comprising:
    a cladding layer between the at least one quantum well structure and the first thermal buffer layer.

12. An optical device, comprising:
    a first structure including a first plurality of layers with different refractive indices, at least some of the first plurality of layers having a first conductivity type;
    a second structure including a second plurality of layers with different refractive indices, at least some of the second plurality of layers having a second conductivity type, the second conductivity type being different than the first conductivity type;
    at least one quantum well structure between the first structure and the second structure to generate light; and
    a first thermal buffer layer of the first conductivity type positioned between the at least one quantum well structure and the first structure,
    wherein a thickness 'd' of the first thermal buffer layer satisfies the following equation:

$$d > \sqrt{D_T \Delta t},$$

where $D_T$ is a thermal diffusivity of the first thermal buffer layer, and $\Delta t$ is a pulse width of a signal that generates a current received by the at least one quantum well structure.

13. The optical device of claim 12, further comprising:
    a second thermal buffer layer positioned between the at least one quantum well structure and the second structure.

14. The optical device of claim 13, wherein the first thermal buffer layer and the second thermal buffer layer comprise a semiconductor material.

15. The optical device of claim 14, wherein the first thermal buffer layer is the first conductivity type, and the second thermal buffer layer is the second conductivity type.

16. The optical device of claim 15, wherein an electrical resistivity of the first thermal buffer layer is uniform and less than a vertical resistivity of the closest layers of the first plurality of layers, and an electrical resistivity of the second thermal buffer layer is uniform and less than a vertical resistivity of the closest layers of the second plurality of layers.

17. The optical device of claim 16, wherein the electrical resistivity of the second thermal buffer layer is less than the electrical resistivity of the first thermal buffer layer.

18. The optical device of claim 12, further comprising:

a cladding layer between the at least one quantum well structure and the first thermal buffer layer.

19. An optical system, comprising:

an optical device that emits light toward an object, the optical device including:
- a first structure including a first plurality of layers with different refractive indices, at least some of the first plurality of layers having a first conductivity type;
- a second structure including a second plurality of layers with different refractive indices, at least some of the second plurality of layers having a second conductivity type, the second conductivity type being different than the first conductivity type;
- at least one quantum well structure between the first structure and the second structure to generate light;
- a first thermal buffer layer positioned between the at least one quantum well structure and the first structure; and
- a second thermal buffer layer positioned between the at least one quantum well structure and the second structure;

a sensor that receives light reflected from the object, the reflected light being a reflected version of the emitted light; and at least one processor that determines a distance to the object based on output of the sensor, wherein an electrical resistivity of the first thermal buffer layer is uniform and less than a vertical resistivity of the closest layers of the first plurality of layers, and wherein an electrical resistivity of the second thermal buffer layer is uniform and less than a vertical resistivity of the closest layers of the second plurality of layers.

20. The optical system of claim 19, wherein a thickness 'd' of the first thermal buffer layer satisfies the following equation:

$$d > \sqrt{D_T \Delta t},$$

where $D_T$ is a thermal diffusivity of the first thermal buffer layer, and $\Delta t$ is a pulse width of a signal that generates a current received by the at least one quantum well structure.

* * * * *